(12) United States Patent
Mobin et al.

(10) Patent No.: US 7,765,078 B2
(45) Date of Patent: Jul. 27, 2010

(54) METHOD AND APPARATUS FOR DIGITAL VCDL STARTUP

(75) Inventors: Mohammad S. Mobin, Orefield, PA (US); Gregory W Sheets, Breinigsville, PA (US); Lane A. Smith, Easton, PA (US); Paul H. Tracy, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 114 days.

(21) Appl. No.: 11/967,619

(22) Filed: Dec. 31, 2007

(65) Prior Publication Data

US 2009/0167379 A1  Jul. 2, 2009

(51) Int. Cl.
*H03L 7/06* (2006.01)

(52) U.S. Cl. ...................................... 702/89

(58) Field of Classification Search ............... 702/89
See application file for complete search history.

(56) References Cited

U.S. PATENT DOCUMENTS

2002/0085656 A1    7/2002  Lee et al.
2007/0002992 A1*   1/2007  Sindalovsky et al. ........ 375/373

* cited by examiner

*Primary Examiner*—Tung S Lau
(74) *Attorney, Agent, or Firm*—Ryan, Mason & Lewis, LLP

(57) ABSTRACT

Methods and apparatus are provided for improved startup of a voltage controlled delay loop that has an injection clock and a return clock. A control signal is determined for a plurality of delay elements in a voltage controlled delay loop by obtaining a histogram count of a number of occurrences of at least one predefined logic value for a plurality of delay settings of the voltage controlled delay loop; determining a histogram count that approximately corresponds to an alignment of at least one edge in the injection and return clocks; and determining the control signal based on the determined histogram count that approximately corresponds to the alignment. The voltage controlled delay loop can be started using the determined control signal. The histogram count can be obtained for a plurality of PVT combinations and the control signal can then be determined for each PVT combination.

17 Claims, 9 Drawing Sheets

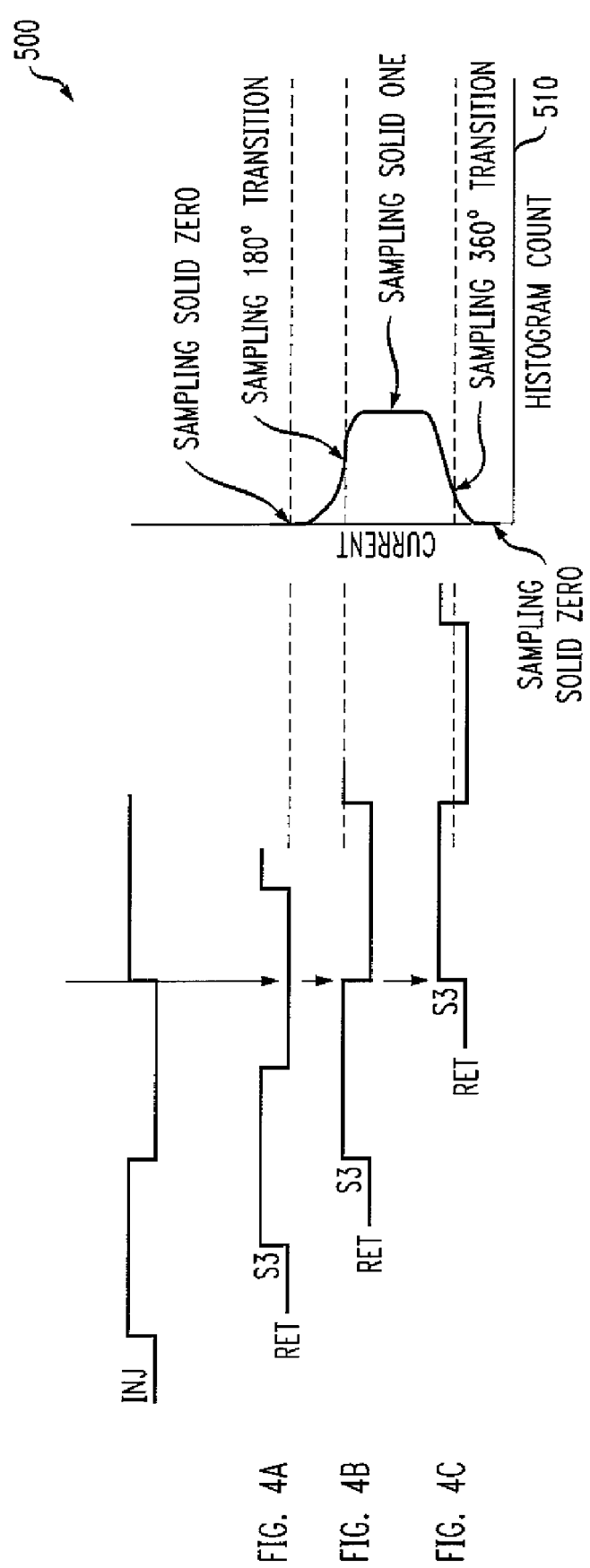

METHOD AND APPARATUS FOR DIGITAL VCDL STARTUP

FIELD OF THE INVENTION

The present invention relates generally to control techniques for voltage controlled delay loops, and more particularly, to digital techniques for determining a startup control current for a voltage controlled delay loop.

BACKGROUND OF THE INVENTION

A number of applications, including certain clock and data recovery (CDR) architectures, require a set of evenly spaced clock waveforms to sample a received data waveform. In these applications, this set of clock waveforms is typically generated by using a voltage-controlled delay line (VCDL). A voltage-controlled delay line 110, as shown in FIG. 1, is an electrical circuit that is comprised of a plurality of sequentially arranged time delay elements, which is often known as a delay chain, driven by a reference clock signal. Thus, an N-cell VCDL generates N output clocks, where each successive output clock is delayed from the input clock by an additional unit delay. The time delays of each of the individual elements that comprise the chain are substantially equal, and are controlled by an analog voltage or current.

It is typically desired that the total delay through the chain of N delay cells be equal to the period, T, of the input reference clock signal, often referred to as the injection clock, INJ. As shown in FIG. 2B, this implies that the time delay between the rising edges (and the delay between the falling edges) of adjacent output clocks is equal to T/N, and also that the rising (and falling) edges of the output of the Nth delay cell, often referred to as the return clock, RET, are aligned to the rising (and falling) edges of the injection clock, INJ. In addition, if the duty cycle of CLKIN is exactly 50%, for any two output clocks that are separated by exactly N/2 cells in the chain, the rising (falling) edge of the earlier clock is aligned to the falling (rising) edge of the later clock.

The time delay through an electrical delay cell varies significantly due to variations in the manufacturing process (P) and with the power supply voltage (V) and operating temperature (T), often collectively referred to as PVT variations. Thus, most applications of VCDLs require a continuous feedback loop, known as a delay-locked loop (DLL), that senses the alignment between the edges of relevant clocks and varies the control voltage to increase or decrease the delay of each stage in the chain, as appropriate, to hold the total VCDL delay equal to T. Typically, a phase detector in the DLL senses the alignment of the edges of certain VCDL clocks. For example, the phase detector may sense the alignment between the rising edge of the injection clock and the rising edge of the output of the final delay cell in the chain (i.e., the return clock).

Duty cycle distortion is a source of impairment in a received signal. The duty cycle of a phase locked loop (PLL) is the percentage of time that the output clock signal has a given value. A PLL should typically demonstrate a 50% duty cycle, such that the output clock signal should alternate between two amplitude values, each for 50% of the total duration. Duty cycle distortion (DCD) arises due to device mismatches and due to variations of the differential signal paths for clock and data. The target 50% duty cycle feature is particularly important for high-speed applications where both positive and negative edges ate used. In addition, each delay element in a VCDL chain acts as a low pass filter. Thus, the corresponding frequency-dependent attenuation will cause the DCD to get progressively worse with each delay element, often referred to as DCD build up.

A need exists for an improved control mechanism for starting up a VCDL with a wide capture range. A further need exists for a VCDL edge alignment process that is substantially immune from PVT variability.

SUMMARY OF THE INVENTION

Generally, methods and apparatus are provided for improved startup of a voltage controlled delay loop that has an injection clock and a return clock. According to one aspect of the invention, a control signal is determined for a plurality of delay elements in a voltage controlled delay loop by obtaining a histogram count of a number of occurrences of at least one predefined logic value for a plurality of delay settings of the voltage controlled delay loop; determining a histogram count that approximately corresponds to an alignment of at least one edge in the injection and return clocks; and determining the control signal based on the determined histogram count that approximately corresponds to the alignment. The control signal can be, for example, a delay control current or a delay control voltage. The voltage controlled delay loop can be started using the determined control signal.

The histogram count can be obtained fox a plurality of PVT combinations. The control signal can then be determined for each of the plurality of PVT combinations. The determined control signal can optionally be stored in a table for each of the plurality of PVT combinations. The control signal can be determined based on the determined histogram count, for example, by processing the histogram count using a state machine to classify a current histogram count into one of a plurality of predefined states.

According to another aspect of the invention, a voltage controlled delay loop is started based on a control signal for a plurality of delay elements in the voltage controlled delay loop by storing a plurality of control signal values in memory, each of the control signal values corresponding to one of a plurality of PVT environments, wherein the control signal values ale based on a histogram count that approximately corresponds to an alignment of at least one edge in the injection and return clocks for each of the plurality of PVT environments; evaluating a PVT environment for the voltage controlled delay loop; determining the control signal for the PVT environment; and starting the voltage controlled delay loop using the determined control signal. The control signal can be a setup and hold delay value.

A more complete understanding of the present invention, as well as further features and advantages of the present invention, will be obtained by reference to the following detailed description and drawings.

BRIEF DESCRIPTION OF THE DRAWINGS

FIG. 5 illustrates a histogram count for the exemplary sub-rate digital startup method of FIGS. 4A-4C;

DETAILED DESCRIPTION

The present invention provides an improved control mechanism for starting up a VCDL with a wide capture range. The disclosed VCDL edge alignment process is substantially immune from PVT variability.

The present invention provides a VCDL start up technique that generates correct multi-phase clock signals using a sub-sampling technique through deterministic digital sequencing. The disclosed digital VCDL startup technique is substantially immune to PVT variation and capable of supporting any frequency range that the delay elements of the VCDL can support.

Figure 1:
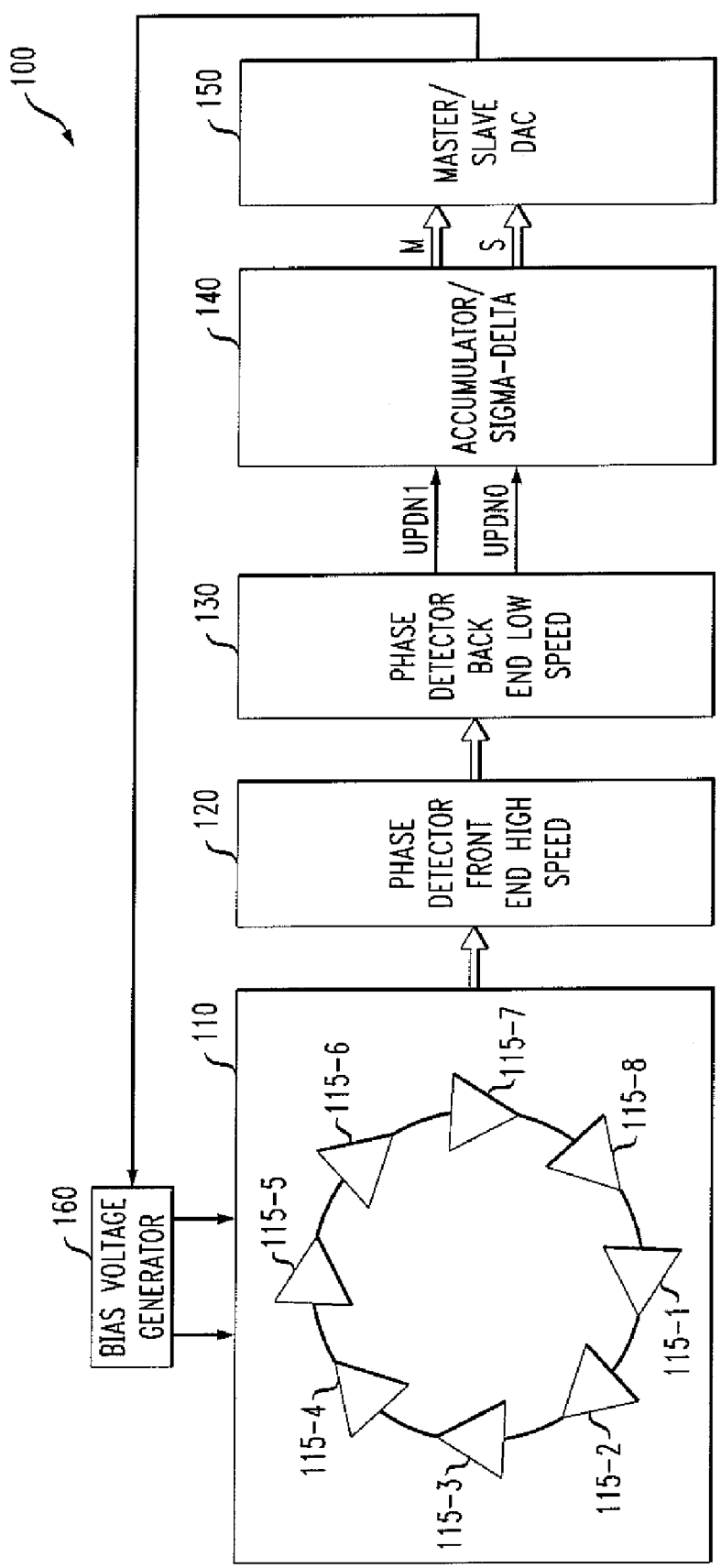
FIG. 1 illustrates an exemplary delay locked loop (DLL) circuit.

FIG. 1 illustrates an exemplary delay locked loop (DLL) circuit 100. As shown in FIG. 1, the DLL circuit 100 comprises a voltage controlled delay line (VCDL) 110, a front end phase detector (high speed) 120, a back end phase detector (low speed) 130, a digital accumulator/sigma-delta modulator 140, a master/slave digital-to-analog converter (DAC) 150 and a bias voltage generator 160. The voltage controlled delay line 110 can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein.

As shown in the exemplary embodiment of FIG. 1, a voltage controlled delay line 110 is typically comprised of a cascaded chain of delay elements 115-1 through 115-N, hereinafter, collectively referred to as delay elements 115, each having a nominal delay value that is controlled by the bias voltage generated by the bias voltage generator 160, to produce a plurality of phase shifted clock signals.

Generally, a phase detector 120/130 determines the time difference between rising edges of the early and late clock signals generated by the voltage controlled delay line 110. If the phase detector 120/130 detects that the late clock lags the early clock, the phase detector 120/130 generates an upward control signal, U, that is proportional to the time lag. Likewise, if the phase detector 120/130 detects that the late clock leads the early clock, the phase detector 120/130 generates a downward control signal, D, that is proportional to the time lead.

The digital accumulator/sigma-delta modulator 140 process the upward and downward control signals from the phase detector 120/130 and generate a corresponding analog value. Generally, the digital accumulator acts as an integrator. The sigma-delta modulator converts the high resolution quantized data, generated by the digital accumulator, into lower resolution quantized data for the master/slave DAC 150. For example, the N bit output of the digital accumulator can be reduced to an M bit output by the sigma-delta modulator, where M is less than N. The sigma-delta modulator may be embodied, for example, using the techniques described in U.S. patent application Ser. No. 11/221,387, entitled "Method and Apparatus for Sigma-Delta Delay Control in a Delay-Locked-Loop," or other techniques that are widely described in the literature, for example, J. Candy and G. Temes, "Oversampling Methods for A/D and D/A Conversion," in Oversampling Delta-Sigma Converters, 1-25 (1992, IEEE Press).

The master/slave DAC 150 generally includes a master DAC that may be used during DLL "coarse" locking, and a slave DAC that may be used during DLL "fine" locking. The analog value generated the DAC 150 is applied to the bias voltage generator 160, which creates the VCDL delay element bias current/voltage, which in turn, changes the delay of the delay elements 115. The process continues until the VCDL loop 100 locks. For a more detailed discussion of sigma-delta modulation and master/slave DAC techniques, see, for example, the above-referenced U.S. patent application Ser. No. 11/221,387, entitled "Method and Apparatus for Sigma-Delta Delay Control in a Delay-Locked-Loop," incorporated by reference herein.

These classical startup techniques perform effectively for the small capture range. As the demand for capture range increases and as the PVT variability increases, however, these classical startup method starts to under perform. Next, some of the issues related to wide capture range VCDL start up are presented.

Duty Cycle Distortion

Figure 2A:
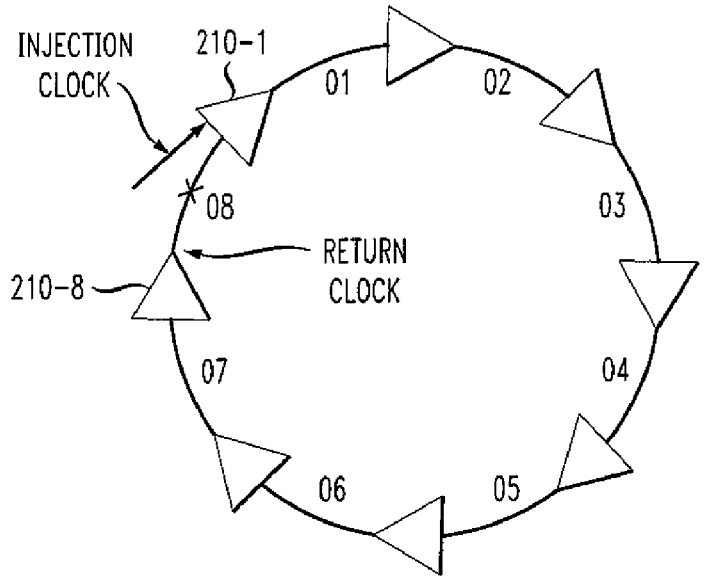
FIG. 2A illustrates an exemplary VCDL comprised of a cascaded chain of delay elements, similar to the VCDL of FIG. 1.
Figure 2B:
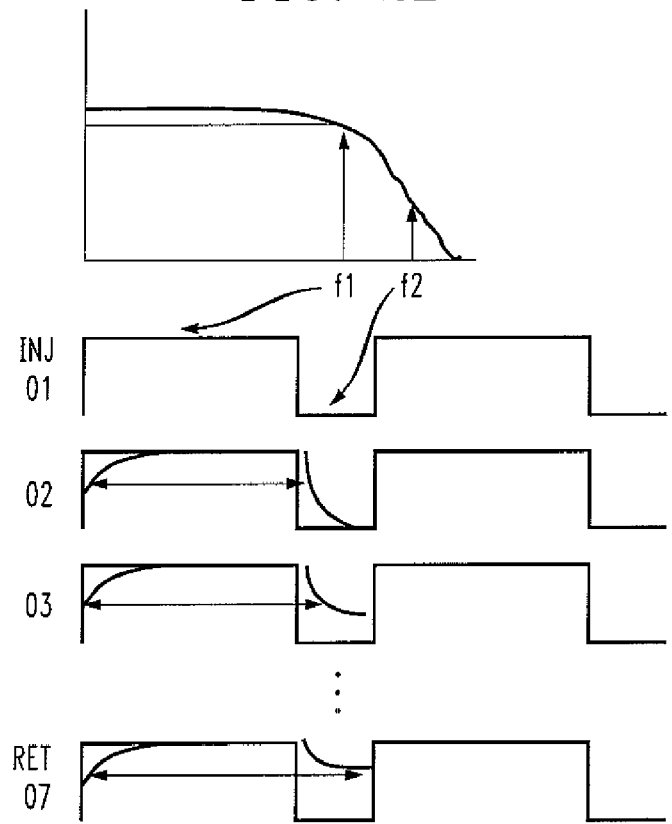
FIG. 2B illustrates the frequency-dependent attenuation associated with the VCDL of FIG. 2A.

FIG. 2A illustrates an exemplary VCDL 200 comprised of a cascaded chain of delay elements, similar to the VCDL 110 of FIG. 1. As shown in FIG. 2A, an injection clock is applied to a first delay element 210-1 in the chain 200 and a return clock is generated by a final delay element 210-8 in the chain 200. FIG. 2B illustrates the frequency-dependent attenuation associated with the VCDL 200. Generally, a VLDL delay element 210 is a low pass filter, as shown by the frequency response in FIG. 2B. The VCDL element 210 delays a clock output with respect to its input phase. A clock can be viewed as having a low frequency component, f1, associated with a first binary value (such as 0), and a high frequency component, f2, associated with the second binary value (such as 1). The low frequency component will less attenuation and the high frequency component will have more severe attenuation, as shown by the frequency response in FIG. 2B. Thus, if the injection clock to the VCDL 200 has DCD it will continue to boost the low frequency component and deemphasize the high frequency component, which in turn results in DCD build up. In an extreme case, the clock signal can gradually disappear at the end of the VCDL chain 200, as illustrated in FIG. 2B.

Edge Alignment Techniques

Figure 3:
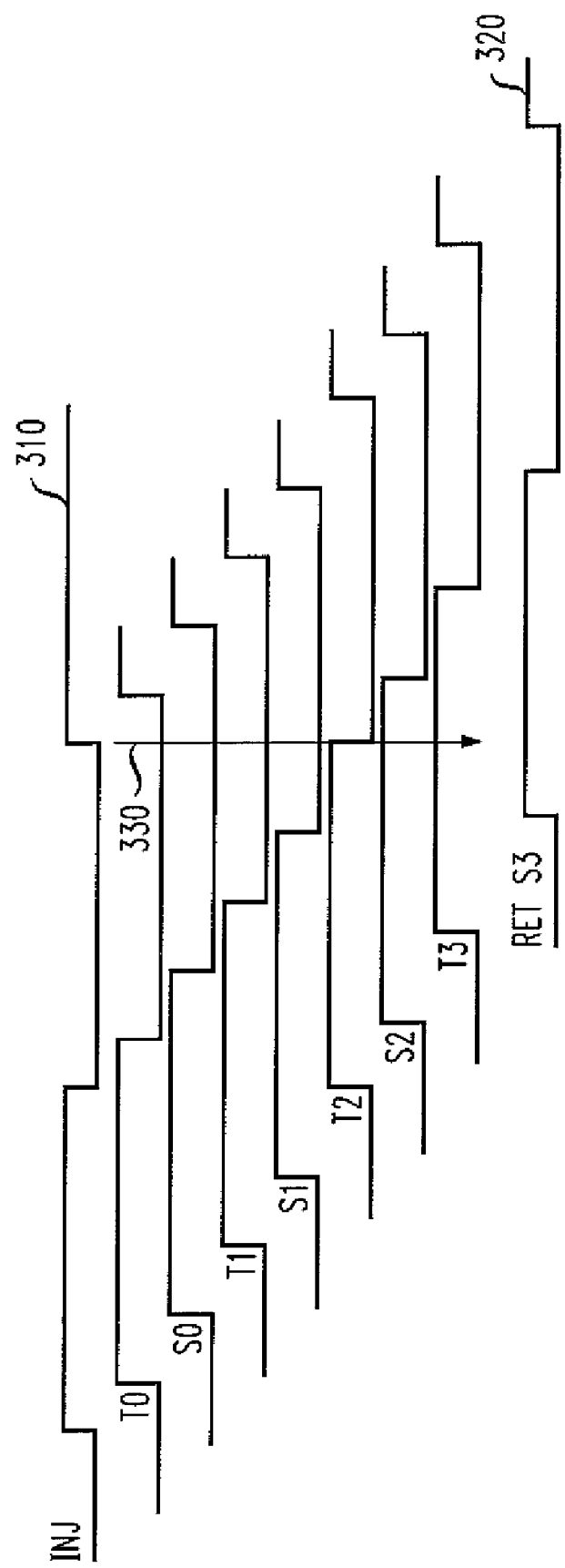
FIG. 3 illustrates a number of VCDL clock signals processed by a conventional edge alignment technique.

FIG. 3 illustrates a number of VCDL clock signals processed by a conventional edge alignment technique. Generally, the edges of the injection and return clocks 310, 320 should be aligned. To achieve this goal, an edge alignment process is implemented. In one conventional alignment technique, a high current is initially introduced as a control current into the VCDL delay elements 115 so that the clock edges generated by the VCDL are close together, as shown in FIG. 3. The current is gradually decreased, which increases the delay for each delay element 115. Each time the current is decreased, an intermediate clock, such as clock T2, is initially sampled in order to identify a rising edge in clock T2. The rising edge in clock T2 triggers an alarm that indicates when to watch for a falling edge in the return clock 320. The sampling of the clock signals is performed on each using edge of the injection clock at a point 330. After the alarm is set, high binary values (1) ate sampled for the return clock (S3) 320. As the current is further decreased (and the delay is thereby increased), a low binary value (0) will eventually be sampled for the return clock 320 (corresponding to a one-to-zero transition, indicating the falling edge). Upon detecting the falling edge, the injection and return clocks 310, 320 are aligned.

While this conventional alignment technique works well for a 50% DCD, it has been found that it is hard to maintain a 50% DCD for high frequencies. In addition, the alarm window is often activated too early or too late. If the alarm is activated too early, the VCDL delay can be minimized which causes the return clock phase to diverge from the injected clock. Likewise, if the alarm is activated too late, too much delay can be asserted by the VCDL delay element, which will continually attenuate the clocks in the VCDL chain and results in progressive DCD build up if the input clock had slight DCD and progressive clock amplitude reduction along the VCDL chain.

Improved VCDL Startup

In older to avoid the above-described VCDL startup problems with the edge alignment process, the VCDL 200 should ideally demonstrate the following characteristics:

1. The injection clock should not have any DCD to stop DCD buildup over the VCDL chain 200;
2. The gain at the operating frequency should be larger than one;
3. The injection clock should not have a DC offset; and
4. Transistors in the VCDL delay elements 210 should be matched carefully.

Of course, one or more of these above-mentioned conditions often cannot be fulfilled. Thus, the present invention recognizes that as long the VCDL delay elements 210 have at least a unity gain, a controlled startup mechanism can be provided to reduce (i) the clock attenuation problem (i.e., progressive amplitude attenuation) due to excessive delay (and hence insufficient delay element gain), as discussed above in conjunction with FIG. 2B, and (ii) the problem of the VCDL locking to the smallest delay (and hence 360 degree mismatch between the injection clock and the return clock).

Figure 4A:
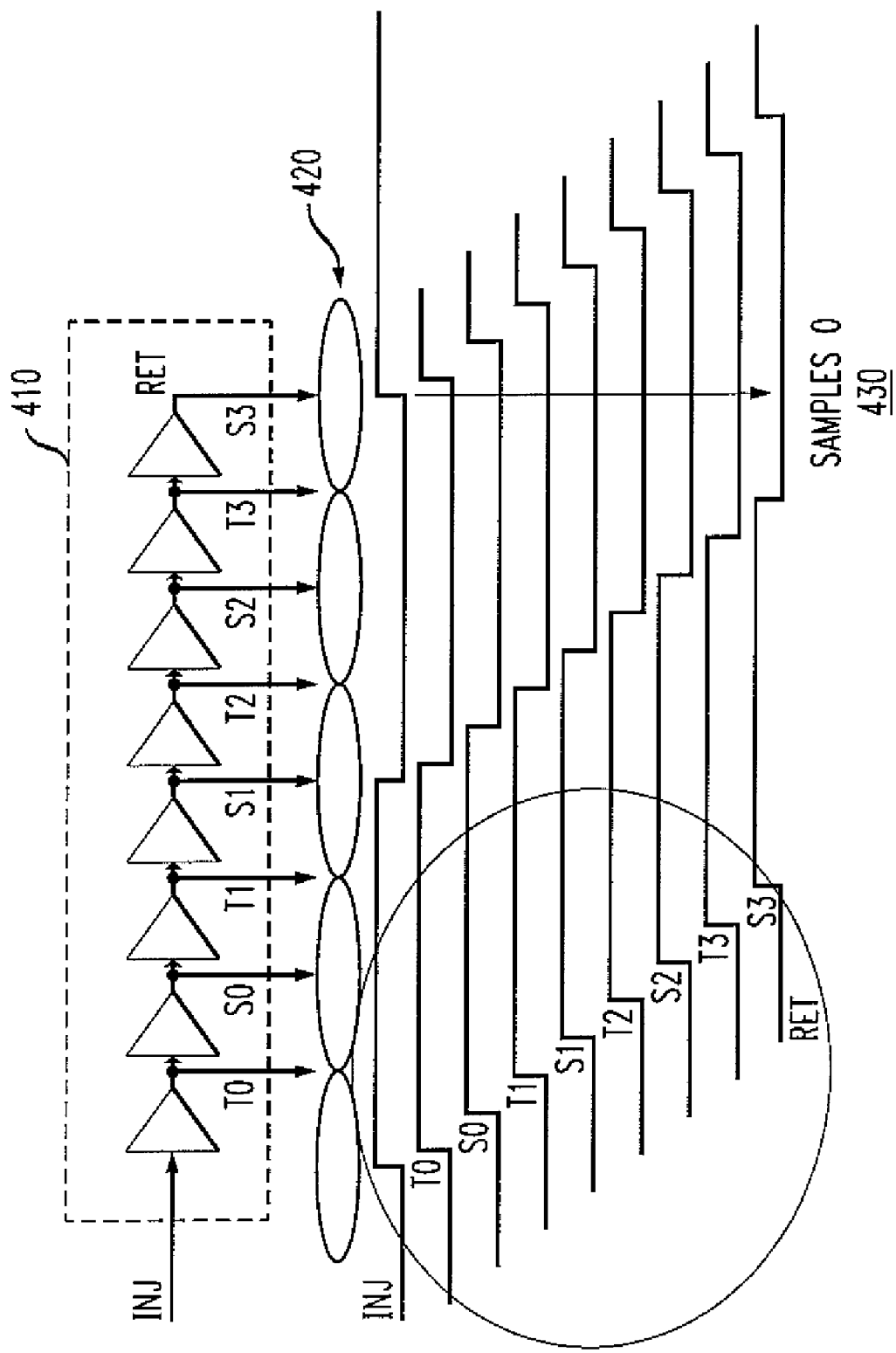
FIGS. 4A through 4C illustrate progressively increasing VCDL delay settings for an exemplary sub-late digital startup method incorporating features of the present invention.
Figure 4B:
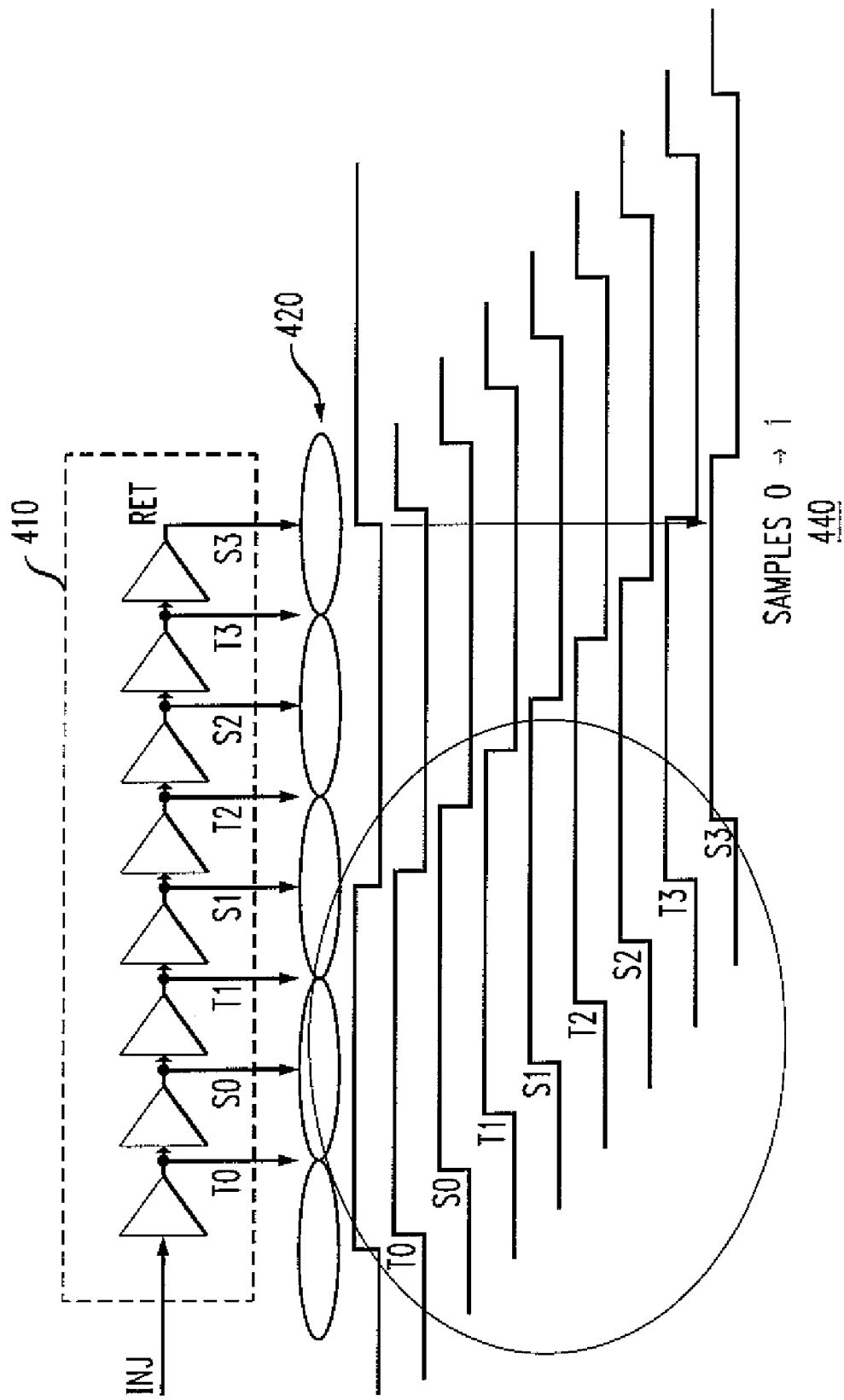
Figure 4C:
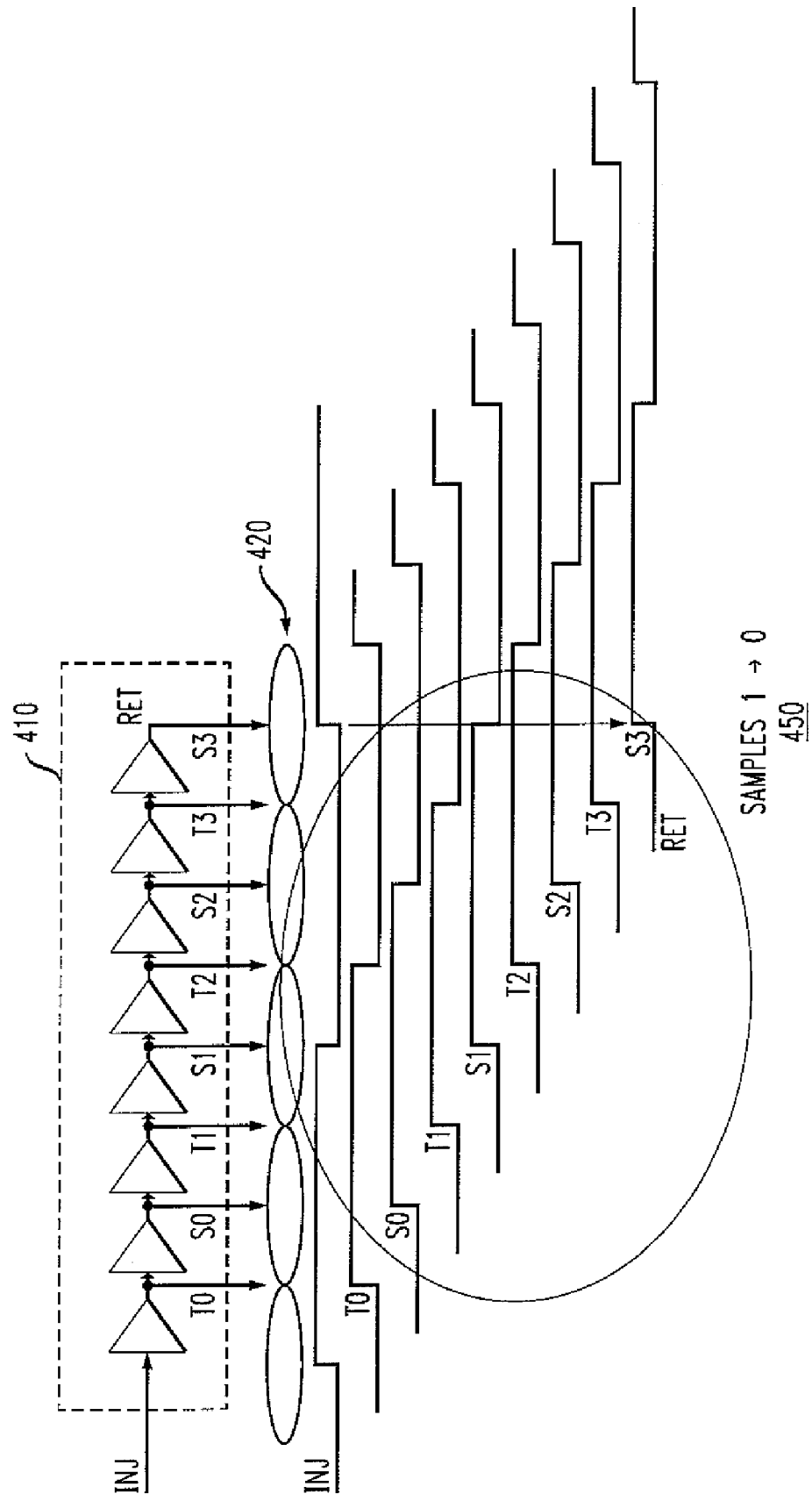

FIGS. 4A through 4C illustrate progressively increasing VCDL delay settings for an exemplary sub-rate digital startup method for a VCDL chain 410, that incorporates features of the present invention. As shown in FIG. 4A, for example, the exemplary VCDL chain 410 generates 8 clocks for the data sampling (S) and transition sampling (T) of four adjacent data eyes 420. Initially, the disclosed sub-rate digital VCDL startup method injects a maximum current into the VCDL delay elements in the chain 410 to produce the lowest delay. As shown in FIG. 4A (corresponding to a maximum current and minimum delay value), at startup, the positive edge of the injection clock samples low binary values (0) on the return clock at a time 430. As discussed further below in conjunction with FIG. 6, any samples of high binary values are counted with an N bit counter to obtain a "hit count" (e.g., a statistical count of the binary signal levels). With the initial minimal delay setting, the hit counter will typically be zero over a count window.

The VCDL delay current is progressively decreased to increase the delay of the VCDL delay elements. For each change in the VCDL delay setting, the hit count is monitored. At a time 440, shown in FIG. 4B (corresponding to an intermediate current and delay value), the hit count will gradually start to increase (i.e., some high logic values will be sampled) when the positive edge of the injection clock starts to sample around the vicinity of the negative edge of the return clock. It is noted that the transition spread is generally a function of clock jitter and the setup and hold values of the sampling latches.

As the current is further decreased in the VCDL 410, the delay of each delay element continues to increase to a maximum value. After the negative edge transition of the return clock is fully sampled, high logic values will be sampled and the hit count will reach its maximum value. The delay stays at its maximum value until the positive edge of the return clock starts to align with the positive edge of the injection clock, at a time 450 (FIG. 4C). The hit count will begin to decrease as some zero logic values are sampled in the transition region of the positive edge. At this point, the positive edges of the injection and return clocks are aligned.

FIG. 5 illustrates a count histogram 500 (as a function of current) for the exemplary sub-rate digital startup method of FIGS. 4A-4C. As shown in FIG. 5, when the VCDL is in the sampling region corresponding to the VCDL delay setting of FIG. 4A (maximum current and thus a minimal delay in the exemplary embodiment), zero values are consistently sampled, so the hit count of high logic values will be approximately zero. During the sampling region corresponding to the VCDL delay of FIG. 4B (sampling 180 degree transition associated with negative edge), both one and zero values ate sampled. During the sampling region between FIG. 4B and FIG. 4C, high logic values are consistently sampled, so the hit count will be at a maximum value. During the sampling region corresponding to the VCDL delay of FIG. 4C (sampling 360 degree transition associated with positive edge when injection and return clocks are aligned), both one and zero values are sampled. During the sampling region between FIG. 4C until it returns back to FIG. 4A, the hit count will father decrease back to zero.

There is a particular legion 510 on the histogram 500 that corresponds to the desired delay setting of FIG. 4C when the positive edges of the injection and return clocks are aligned. The present invention recognizes that the current setting corresponding to region 510 should be used to start the VCDL 410. In one exemplary embodiment, the delay current setting can be adjusted to account for the sampling latch setup time. As previously indicated, however, the time delay through an electrical delay cell varies significantly due to PVT variations. Thus, according to one aspect of the present invention, a number of histograms, such as the histogram 500 of FIG. 5, are obtained during a training phase to characterize the delay characteristics of a VCDL device for various delay current settings and PVT combinations. The results of the histogram analysis can be stored, fox example, in a look up table. For example, for each PVT combination, the look up table can indicate the corresponding histogram count and/or corresponding delay control current setting that corresponds to an alignment of the positive edges of the injection and return clocks, as well as the corresponding VCDL delay current setting. The indicated delay control current can be used to start the VCDL. The PVT conditions can be obtained using a PVT detector, such as those described in Qadeer A. Khan et al "Techniques for On-Chip Process Voltage and Temperature Detection and Compensation," Proc. of the 19th International Conference on VLSI Design (VLSID'06) or Gu-Yeon Wei et al., "A Variable-Frequency Parallel I/O Interface with Adaptive Power Supply Regulation," 2000 IEEE International Solid-State Circuits Conference, each incorporated by reference herein. Thus, for a given measured PVT combination, the look-up table identifies the corresponding VCDL delay current setting that should be used to start the VCDL.

Figure 6:
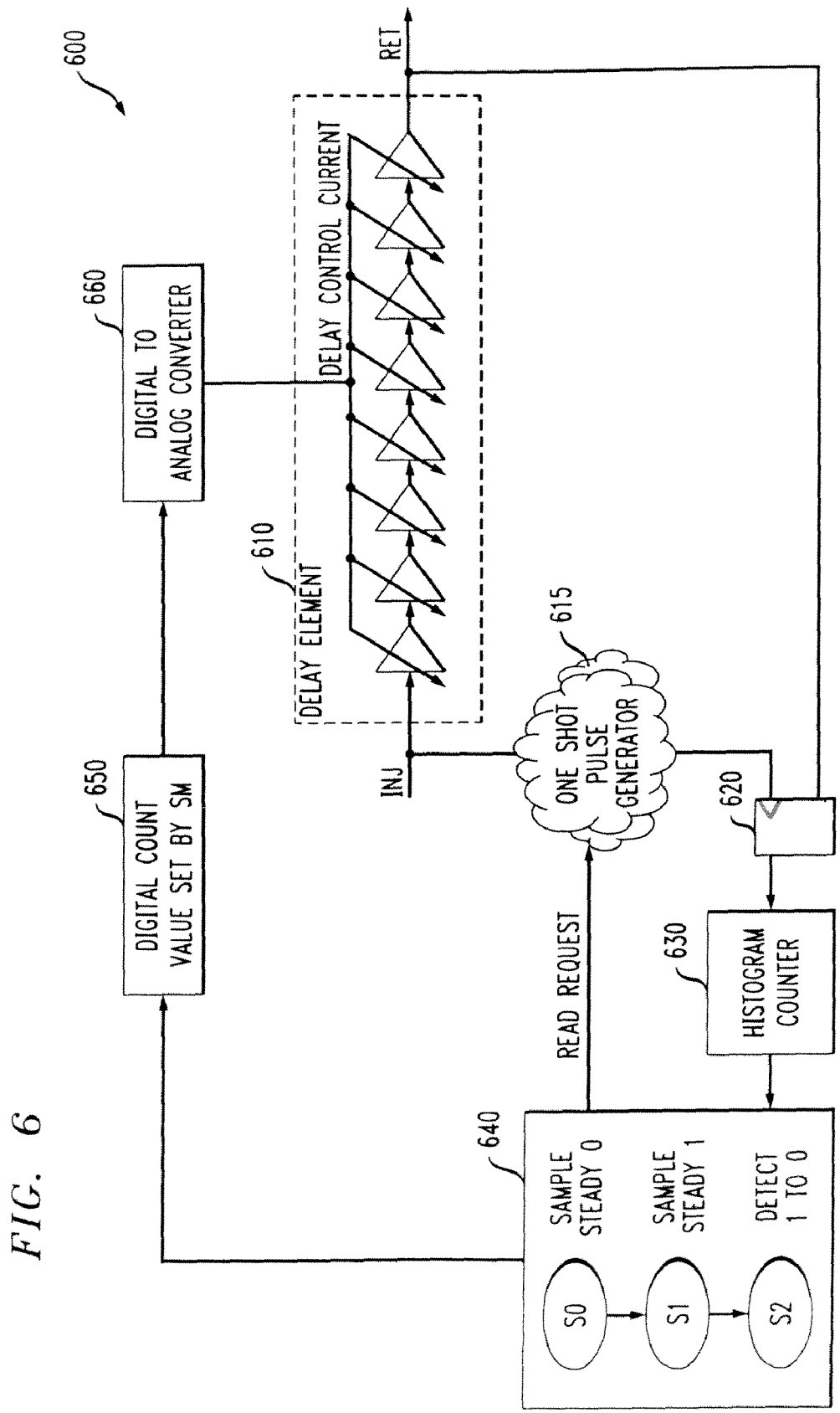
FIG. 6 is a schematic block diagram of a VCDL startup state machine that incorporates features of the present invention.

FIG. 6 is a schematic block diagram of a VCDL startup state machine 600 that incorporates features of the present invention. As shown in FIG. 6, the VCDL 610 includes a plurality of delay elements that each have an adjustable delay based on a delay control current. The return clock from the final delay element in the chain 610 is applied to a latch 620 Latch 620 samples the return clock based on a rising edge of the injection clock. In one exemplary embodiment, the rising edge of the injection clock is obtained from a pulse generator 615, discussed further below in conjunction with FIG. 7. The sampled value that is output from the latch 620 is applied to a histogram counter 630. The histogram counter 630 may be embodied using the data eye monitoring techniques described, for example, in U.S. patent application Ser. No. 11/095,178, filed Mar. 31, 2005, entitled "Method and Apparatus for Monitoring a Data Eye in a Clock and Data Recovery System," incorporated by reference herein.

The hit count generated by the histogram counter 630 is applied to a state machine 640 that monitors the hit count to classify the VCDL into one of three states, S0 through S2, Corresponding to various portions of interest of the histogram 500. Based on the measured hit count, the state machine 640 can determine where the VCDL 610 is along the histogram, and whether the positive edges of the injection and return clocks are currently aligned. Based on the determined state, the state machine 640 generates a count value 650 (for example, using the look-up table described above) that is applied to a digital-to-analog converter 660. The digital-to-analog converter 660 generates the delay control current for the delay elements in the chain 610, based on the applied count value 650. In this manner, the positive edges of the injection and return clocks will align.

At the high rates that are typical for VCDL clocks running at multi GHz frequencies, it may be difficult to implement the histogram counter 630. To relax the circuit implementation of the histogram counter 630, without sacrificing the performance of the proposed method described above in conjunction with FIG. 6, a sub rate sampler can be employed. In this manner, the return clock can be sub-sampled at a rate that is less than the rate of the injection clock. Generally, as shown in FIG. 6, the state machine 640 issues a read request, such as a zero-to-one transition in the exemplary embodiment. As discussed further below in conjunction with FIG. 7, the read request triggers the one shot pulse generator 700 of FIG. 7 to generate a one shot pulse that is synchronized with the edge of the injection clock. The one shot pulses occur at a rate at which the state machine generates the zero-to-one transitions (read requests). Each one shot pulse then samples the return clock, as discussed further below in conjunction with FIG. 7.

Figure 7:
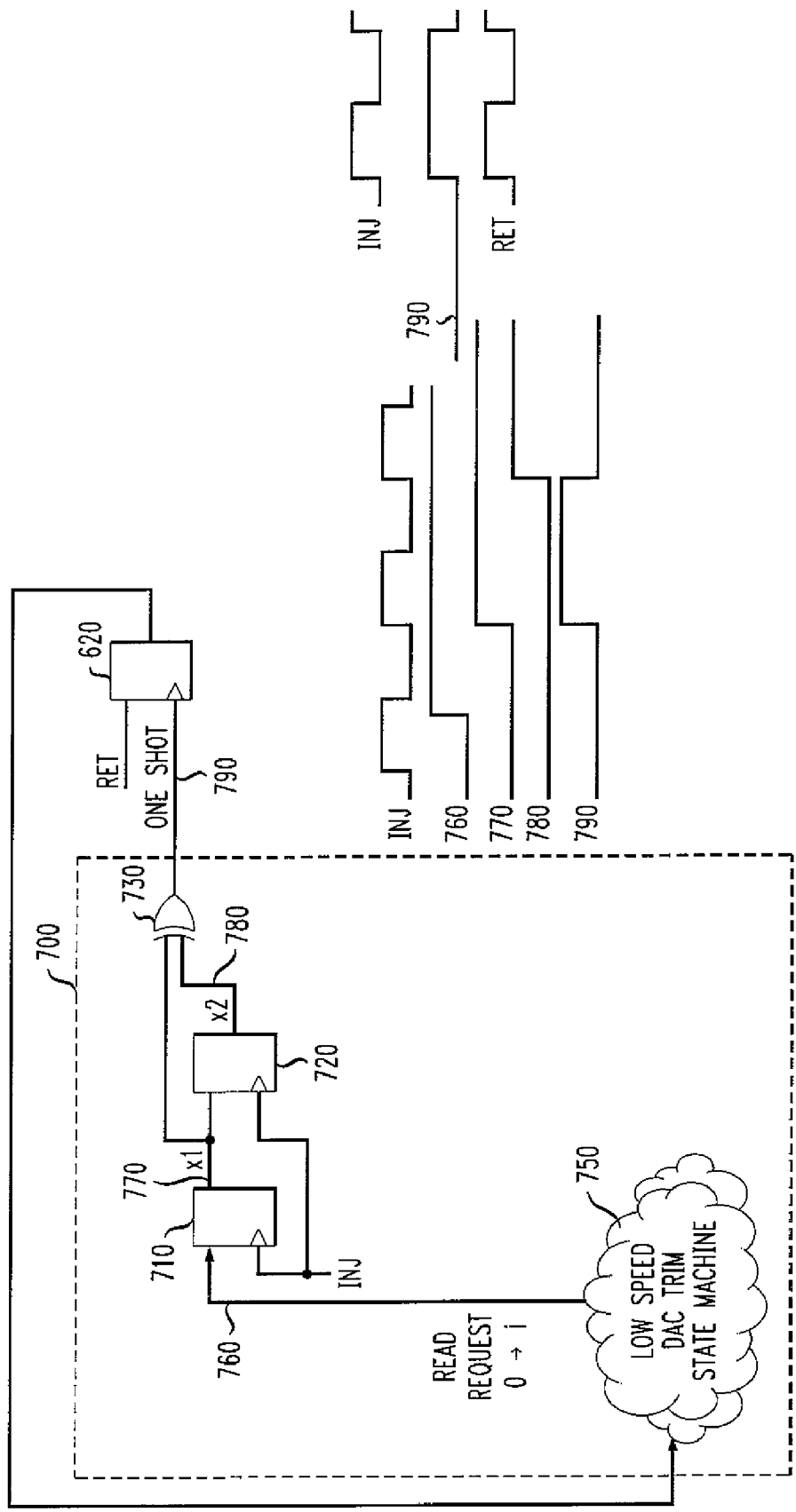
FIG. 7 is a schematic block diagram of an exemplary one shot pulse generator of FIG. 6.

FIG. 7 is a schematic block diagram of an exemplary one shot pulse generator 700. The one shot pulse generator 700 of FIG. 7 corresponds to the pulse generator 615 and the state machine 640 of FIG. 6. As shown in FIG. 7, a first latch 7710 samples the read requests 760 from the state machine 750, based on a rising edge of the injection clock. The state machine 750 generates a 0 to 1 transition that is the read request signal 760. The first latch 710 generates a signal 770 that is sampled by a second latch 720, based on a rising edge from the injection clock. The second latch 720 generates a signal 780 that is applied to an exclusive or (XOR) gate 730 with the signal 770. The XOR gate 730 will generate the one shot output value 790, having a logic high value whenever the inputs have different values. A third latch 620 (shown in FIGS. 6 and 7) samples the return clock based on a rising edge from the one shot output value 790 it is again noted that the state machine 750 generates the 0 to 1 transition that creates the one shot pulse 790. The positive edge of this one shot pulse samples and holds the return clock at latch 620 for use by the histogram counter 630 of FIG. 6.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for determining a control signal for a plurality of delay elements in a voltage controlled delay loop, wherein said voltage controlled delay loop has an injection clock and a return clock, said method comprising:
    obtaining a histogram count of a number of occurrences of at least one predefined logic value for a plurality of delay settings of said voltage controlled delay loop;
    determining a histogram count that approximately corresponds to an alignment of at east one edge in said injection and return clocks; and
    determining said control signal based on said determined histogram count that approximately corresponds to said alignment.

2. The method of claim 1, wherein said control signal is one or more of a delay control current and a delay control voltage.

3. The method of claim 1, wherein said step of obtaining a histogram count further comprises the step of sub-sampling said return clock using a one shot pulse.

4. The method of claim 1, wherein said histogram count is obtained for a plurality of PVT combinations.

5. The method of claim 1, wherein said histogram count is obtained using a data eye monitor.

6. The method of claim 1, wherein said step of determining said control signal based on said determined histogram count further comprises the step of processing said histogram count using a state machine to classify a current histogram count into one of a plurality of predefined states.

7. The method of claim 1, further comprising the step of starting said voltage controlled delay loop using said determined control signal.

8. The method of claim 3, wherein said control signal is determined for each of said plurality of PVT combinations.

9. The method of claim 3, wherein said determined control signal is stored in a table for each of said plurality of PVT combinations.

10. An apparatus for determining a control signal for a plurality of delay elements in a voltage controlled delay loop, wherein said voltage controlled delay loop has an injection clock and a return clock, said apparatus comprising:
- a data eye monitor for obtaining a histogram count of a number of occurrences of at least one predefined logic value for a plurality of delay settings of said voltage controlled delay loop;
- means for determining a histogram count that approximately corresponds to an alignment of at least one edge in said injection and return clocks; and
- means for determining said control signal based on said determined histogram count that approximately corresponds to said alignment.

11. The apparatus of claim 10, wherein said control signal is one or more of a delay control current and a delay control voltage.

12. The apparatus of claim 10, wherein said histogram count is obtained by sub-sampling said return clock using a one shot pulse.

13. The apparatus of claim 10, wherein said histogram count is obtained for a plurality of PVT combinations.

14. The apparatus of claim 10, wherein said control signal is determined based on said determined histogram count by processing said histogram count using a state machine to classify a current histogram count into one of a plurality of predefined states.

15. The apparatus of claim 13, wherein said control signal is determined for each of said plurality of PVT combinations.

16. The apparatus of claim 13, wherein said determined control signal is stored in a table for each of said plurality of PVT combinations.

17. An apparatus for determining a control signal for a plurality of delay elements in a voltage controlled delay loop, wherein said voltage controlled delay loop has an injection clock and a return clock, said apparatus comprising:
- a data eye monitor for obtaining a histogram count of a number of occurrences of at least one predefined logic value for a plurality of delay settings of said voltage controlled delay loop;
- a histogram counter for determining a histogram count that approximately corresponds to an alignment of at least one edge in said injection and return clocks; and
- a state machine for determining said control signal based on said determined histogram count that approximately corresponds to said alignment.

* * * * *